July 13, 1965 R. N. LONGUEMARE, JR., ETAL 3,195,057

WIDE BANDWIDTH LIMITING CIRCUIT

Filed Aug. 10, 1961 2 Sheets-Sheet 1

INVENTORS.
ROBERT N. LONGUEMARE
JOSEPH CANZONERI III
BY
W. E. Quesenberry
R. Hodges ATTYS.
Paul R. Harder AGENT.

*INVENTORS.*
ROBERT N. LONGUEMARE
JOSEPH CANZONERI III
*BY* W. E. Quesenberry
O. E. Hodges
ATTYS.
Paul L. Harder
AGENT.

United States Patent Office 3,195,057
Patented July 13, 1965

3,195,057
WIDE BANDWIDTH LIMITING CIRCUIT
Robert N. Longuemare, Jr., Halethorpe, Md., and Joseph Canzoneri III, Houston, Tex., assignors, by mesne assignments, to the United States of America as represented by the Secretary of the Navy
Filed Aug. 10, 1961, Ser. No. 130,699
10 Claims. (Cl. 328—168)

The present invention relates to wide band amplifiers and more particularly to an improved diode clipping circuit which presents a relatively low loading factor to the input signal source.

Most prior art clipping circuits when employed in a wide band video amplifier show definite deficiencies particularly where the source of signal voltage to be limited is at a very low impedance level.

The present invention contemplates a clamping diode arrangement whereby clipping is accomplished without significant loading of the input circuit and wherein the desired limit level may be varied over a wide range of voltages by means of a simple adjustment.

It is therefore, an object of the invention to provide an unique clipping circuit having good limiting action without loading of the input source and without the necessity of additional bias currents or voltages in the signal circuit.

It is another object to provide a clipping circuit without the introduction of additional series impedance or shunt capacitance in the signal circuit.

A further object is to maintain the prescribed limit level with a minimum dependence on such variable factors as vacuum tube grid cut-off voltage and grid or plate saturation.

Still another object of the invention is to provide a clipping circuit operable over the entire frequency range from direct current into the megacycle region and to permit the limit level to be varied over a wide voltage range by means of a simple adjustment.

A still further object is to provide a clipping circuit having the aforedescribed characteristics without the use of additional active elements and while maintaining the number of components required at a minimum.

Other objects and many of the attendant advantages of this invention will be more readily appreciated as the same becomes better understood by reference to the following detailed description when considered in connection with the accompanying drawings in which like reference numerals designate like parts throughout the several figures and wherein:

FIG. 2(*a*) is as schematic diagram of the effective amplifier circuit of FIG. 1 when the circuit is operating below the desired clipping level;

FIG. 2(*b*) is the effective amplifier circuit of FIG. 1 when the circuit is operating above the clipping level;

Figures 1, 2A, 2B:
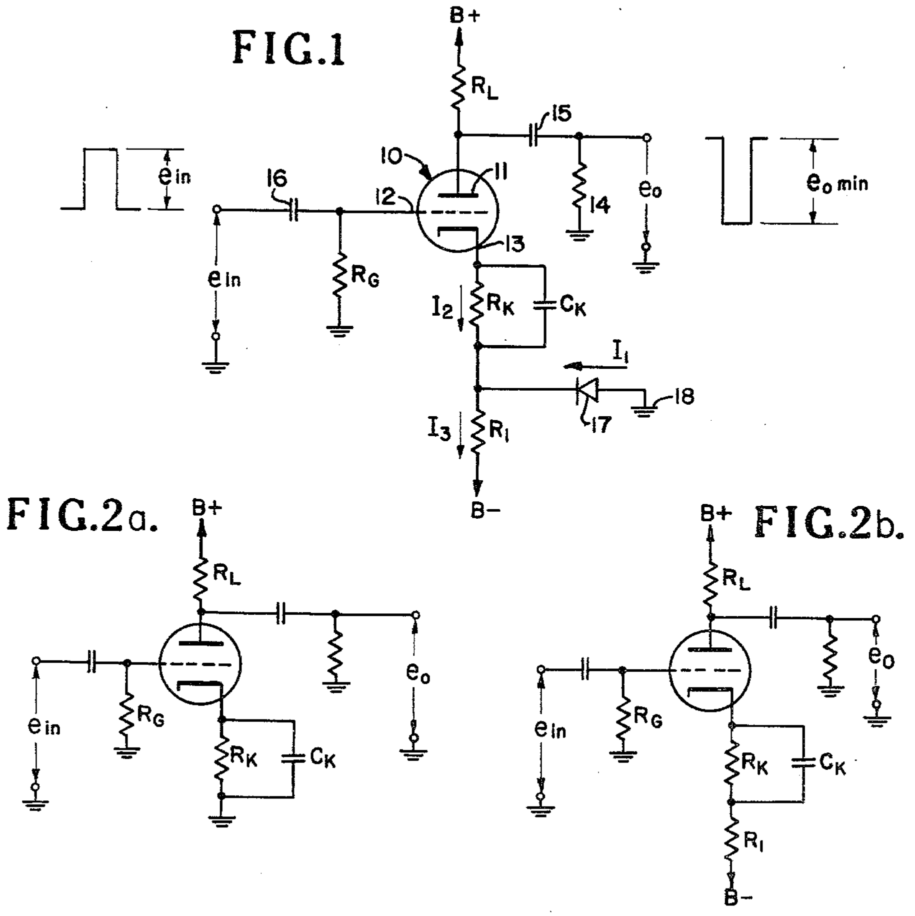
FIG. 1 is a schematic diagram of a plate loaded amplifier embodying the instant invention.

Referring now to FIG. 1 there is illustrated a plate loaded amplifier circuit comprising a triode 10 having an anode 11, a grid 12, and a cathode 13. The anode 11 is connected by way of load resistor $R_L$ to a source of plate voltage B+. The output signal $e_0$ is taken across resistor 14, capacitively coupled to the load resistor $R_L$ through capacitor 15.

Input signal $e_{in}$ is applied across grid resistor $R_G$ by way of coupling capacitor 16. Cathode 13 is connected through a parallel resistance-capacitance combination $R_KC_K$ to one side of resistor $R_1$, the other side of resistor $R_1$ is connected to a suitable source of negative potential, for example, B—.

Clamping diode 17 has its cathode connected to the junction of $R_KC_K$ and $R_1$ and its anode connected to a point of reference potential 18, such, for example, as ground, reference potential 18 being intermediate B+ and B—. It should be noted that the input and output signals are taken relative to this intermediate potential.

The clipping circuit of FIG. 1 is arranged to operate on a positive going input signal and to provide a desired minimum output signal as will become more readily apparent as the description proceeds.

With no signal input to the grid 12, the bias conditions are chosen in a manner to provide a quiescent current $I_{2q}$ flowing through the tube 10. Assume it is desired to limit the output voltage to a minimum value of $e_{0\,min}$, then the amount of current change through load resistor $R_L$ to produce this output voltage is $$\Delta I_{2m}=\frac{e_{0\,min}}{R_E}$$

Thus when the total current through the tube reaches the value $I_{2q}+\Delta I_{2m}$ it is desired to prevent the output voltage from decreasing significantly beyond this level.

Clamping diode 17 is initially conducting, and because of its low dynamic impedance, holds the junction of $R_1$ and $R_KC_K$ close to ground potential. Since this junction is maintained close to ground as long as diode 17 is conducting, the entire B— voltage is impressed across $R_1$ and the current flow through it depends only on the values of $R_1$ and B—. The current through $R_1$ is therefore given by the equation $$I_3=\frac{V_{B-}}{R_1}$$

To provide limiting action at the output level $e_{0\,min}$, resistor $R_1$ is chosen such that the current $I_3$ is equal to $I_{2q}+\Delta I_{2m}$. Therefore, when no signal voltage is present at the input, the current $I_1$ through the diode 17 equals $\Delta I_{2m}$, since $I_1=I_3-I_2$. As long as the current $I_1$ is sufficient to bring diode 17 into the conducting region, the dynamic resistance from $R_KC_K$ to ground will be quite low and $R_1$ will have a negligible effect on the amplifier gain.

As the input signal rises, the tube current $I_2$ increases and since, as long as diode 17 is conductive, and the junction of $R_K$ and $R_1$ is held near ground potential, the voltage across $R_1$ remains substantially $V_{B-}$, therefore, maintaining $I_3$ substantially constant, the current $I_1$ through diode 17 must accordingly decrease. When $e_{in}$ is of sufficient magnitude to increase the current through the tube to the value $I_{2q}+\Delta I_{2m}$, $I_1$ drops to zero and diode 17 cuts off, presenting a very high resistance to ground.

The resistor-capacitor combination $R_KC_K$ is arranged such that the impedance offered to an alternating current is negligibly small relative to the other impedances of the circuit. $R_K$ is selected so as to yield the desired direct current bias voltage between the cathode and the grid.

If the effective alternating current impedance of $R_KC_K$ is small, the cathode circuit resistance, once diode 17 ceases to conduct, is equal to $R_1$ and the amplifier gain drops to approximately $R_L/R_1$. Since in general, the ratio $R_L/R_1$ can be made much less than unity, the stage ceases to amplify and the output is held nearly constant at the desired voltage output $e_{0\,min}$.

FIG. 2(*a*) illustrates the effective amplifier circuit when $e_0$ is greater than $e_{0\,min}$, i.e., when diode 17 is conducting.

FIG. 2(*b*) illustrates the effective amplifier circuit after diode 17 has ceased to conduct, thereby representing essentially an open circuit to ground.

Prior to reaching the desired limit level, the diode maintains the junction of $R_KC_K$ and $R_1$ essentially at ground potential. However, when the prescribed limit level is reached, this clamp is removed and allows the cathode voltage to rise, preventing the grid from being driven positive with respect to the cathode over the now increasing dynamic range of the tube. This prevents the flow of grid current and avoids undesirable loading or clamping effects on the input circuit.

The limiting action is achieved without alteration of the signal path, and requires the addition of only two components, a diode and a resistor, to a conventional amplifier stage. The amplifier gain and bandwidth are unaffected by the limiter and the circuit will operate over the entire frequency range from direct current to the upper limits of the amplifier. The effects of the tube bias variations on the limit level can be minimized as desired by choice of the value of bias resistor $R_K$. The diode 17 is used primarily as an on-off device, and in most applications its characteristics, other than response time, are not critical as compared with circuits which utilize the Zener or reverse breakdown diodes. Further by making resistor $R_1$ variable the clipping level may be varied over the entire dynamic range of the tube.

Figure 3:
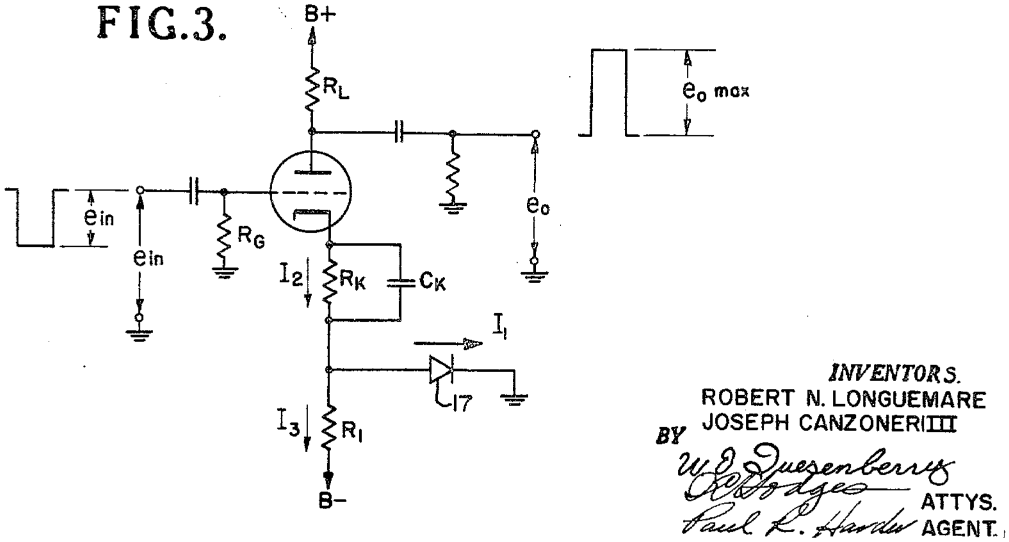
FIG. 3 is a schematic diagram of another embodiment of the instant invention.

FIG. 3 illustrates the limiting circuit arranged to clip a negative going input signal by merely reversing the polarity of the doide 17. It will be readily apparent to those skilled in the art, that as the input signal swings negative with respect to ground, the current $I_2$ through the tube falls below the quiescent current $I_{2q}$. If it is desired to limit the output signal to a maximum value $e_{0\ max}$, the change in current required to produce this output voltage will be $-\Delta I_{2m}$. As will be apparent from the analysis of FIG. 1, if the current through diode 17 is made equal to $-\Delta I_{2m}$, as the current $I_2$ decreases, the diode current $I_1$ will also decrease until diode 17 is cut off. At this point, the clamping action of the diode is removed and the voltage at junction of $R_K$ and $R_1$ is allowed to decrease below ground potential and the gain of the circuit again becomes approximately $R_L/R_1$. The potential of the cathode is, therefore, allowed to swing negative thereby maintaining a positive potential at the cathode with respect to the grid and avoiding the undesired input loading or clamping effects in the same manner as pointed out in the analysis of FIG. 1.

Figure 4:
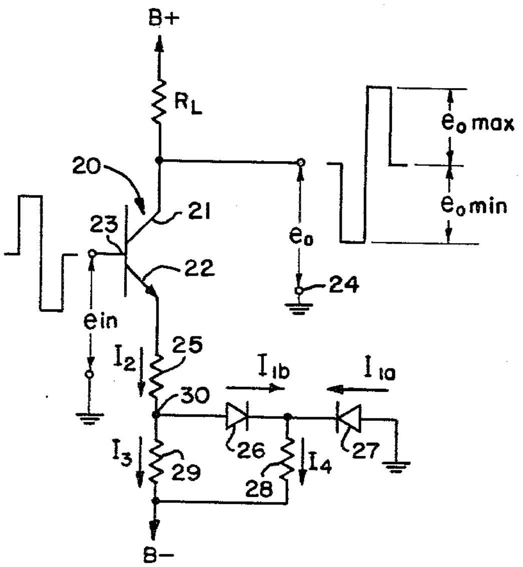
FIG. 4 is a circuit diagram of a transistor amplifier having a circuit configuration for limiting both positive and negative input signals.

FIG. 4 illustrates a unique combination of both the positive and negative clipping circuits utilized in a grounded-emitter amplifier. The circuit comprises a NPN transistor 20 having a collector 21, an emitter 22, and a base 23. The collector 21 is connected through resistor $R_L$ to a suitable source of potential B+. The output $e_0$ being taken between the collector and ground 24.

The emitter 22 is connected to resistor 25. A pair of diodes 26, 27 are reversely connected between resistor 25 and ground, their cathodes being connected through resistor 28 to a source of negative potential B−. A resistor 29 is connected between potential source B− and the injunction 30 of resistor 25 and the anode of diode 26. Input signal $e_{in}$ is applied to the base 23 relative to ground potential 24.

A quiescent current $I_{2p}$ is established through transistor 20 for a zero input signal. The circuit is also arranged such that both diode 26 and diode 27 are conducting under quiescent conditions. Since the dynamic impedance of these diodes is relatively low as long as both are conducting, the junction 30 will be held very close to ground potential.

For a positive going input signal and a desired minimum output voltage $e_{0\ min}$, the required current change is again $$\Delta I_{2m}=\frac{e_{0\ min.}}{R_L}$$

If the current $I_{1a}$ through diode 27 is made equal to $\Delta I_{2m}$ under quiescent conditions, when the desired minimum voltage $e_{0\ min}$ is reached, diode 27 cuts off to allow the junction 30 to swing positive.

The impedance from junction 30 to B− under the condition when diode 27 is cut off, and neglecting the impedance of diode 26 is given by the equation:

$$\frac{1}{R}=\frac{1}{R_{29}}+\frac{1}{R_{28}}$$

If the resistor 28 is large with respect to resistor 29 then the effective impedance of the circuit is merely the resistance 29. Therefore, when diode 27 cuts off, if resistor 28 is large with respect to resistor 29, only resistor 28 is added to the effective emitter circuit and having a degenerative effect upon the output, limits the voltage to $e_{0\ min}$.

For negative going input signals, the maximum output voltage $e_{0\ max}$ may be limited in like manner, by making the current $I_{1b}$ through diode 26 equal to $-\Delta I_{2m}$. As the current $I_2$ decreases, $I_{1b}$ will decrease until it reaches zero, at which time diode 26 cuts off, allowing the junction 30 to swing negative with respect to ground. Resistor 29 is again added to the emitter circuit and has a degenerative effect to limit the output voltage to $e_{0\ max}$.

By making resistor 28 large with respect to resistor 29, the circuit will limit equally for both positive and negative going input signals. It will be readily apparent to one skilled in the art, that by reducing the value of resistor 28, the effective resistance of the emitter circuit during clipping for positive going input signals may be made less than the effective resistance during negative going input signals and asymmetrical clipping is thus obtained.

It is further apparent, that by making resistors 28 and 29 variable the desired clipping level may be varied as desired over the entire dynamic range of the transistor.

The circuit illustrated in FIG. 4 avoids, as does those illustrated in FIG. 1 and FIG. 3, undesired loading on the input source by allowing the emitter to follow the base voltage once the clipping level is reached.

Figure 5:
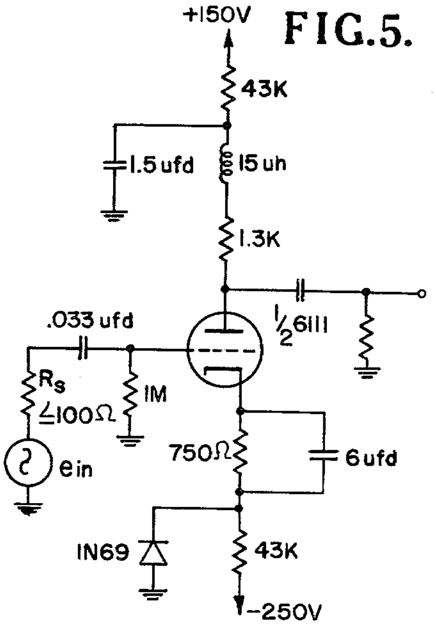
FIG. 5 is a circuit diagram of a video amplifier employing one embodiment of the invention.
Figure 6:
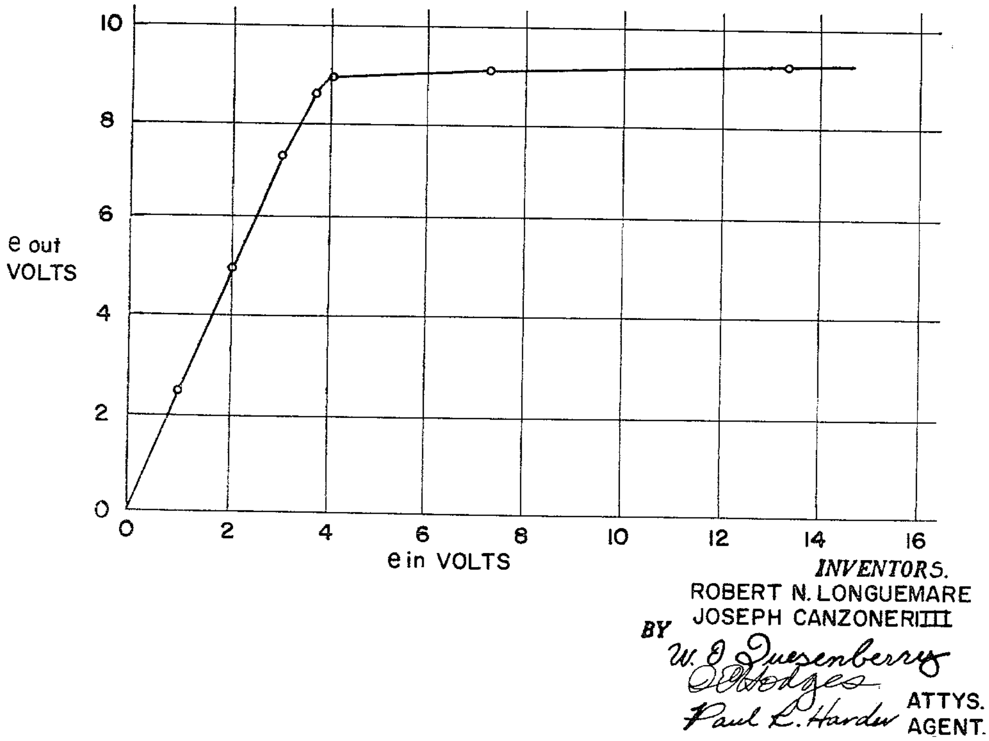
FIG. 6 is a graph of the measured performance of the circuit of FIG. 5.

FIG. 5 is a schematic diagram of a video amplifier embodying one form of the present invention. The amplifier has a measured bandwidth of roughly 15 mc. with a gain of 2.5. The limit level was set at four volts on the input and the measured performance is illustrated in FIG. 6. The circuit will accept over 15 volts on the input grid without significant loading. FIG. 6 clearly shows that the circuit of FIG. 5 when presented with an input ranging between zero and four volts results in the desired amplification and an output signal which ranges between zero and nine volts. When the input voltage reaches 4 volts, the limit level of the circuit as determined by the circuit element parameters, the output signal is effectively clipped at the 9 volt level and remains substantially at this level even when the input signal is raised to 15 volts.

There has been illustrated and described a variable clipping circuit, readily adaptable to standard amplifier circuits, which is simple in construction, flexible in utility, yet provides an effective method of clipping signals over a wide range of frequencies without significant loading of the input signal source.

Obviously many modifications and variations of the present invention are possible in the light of the foregoing description and it should therefore be understood that within the scope of the appended claims, the invention may be practiced otherwise than as specifically described.

What is claimed as new and desired to be secured by Letters Patent of the United States is:

1. A single stage amplifier having a clipping circuit for limiting the amplitude of the output of the amplifier while presenting a low loading factor to the input signal source comprising an amplifier having an anode, a cathode and a grid, a source of potential having a positive terminal, a negative terminal and an intermediate terminal, a first resistor connected between said positive terminal and said plate, a second resistor and a third resistor connected in series between said cathode and said negative terminal in a manner to form a junction between the resistors, a capacitor connected in parallel with said second resistor, an input circuit connected to said grid and said intermediate potential, an output circuit connected to said plate and said intermediate terminal, and means connected to said intermediate terminal and said junction whereby said junction is held near the potential of said intermediate terminal until the output signal reaches a predetermined amplitude and whereby the incremental gain of said amplifier is reduced after said predetermined amplitude is reached.

2. The single stage amplifier of claim 1 wherein said means is a diode having its anode connected to said intermediate terminal and its cathode connected to said junction.

3. The single stage amplifier of claim 1 wherein said means is a diode having its cathode connected to said intermediate terminal and its anode connected to said junction.

4. The circuit of claim 2 wherein the impedance of said second resistor and said capacitor is arranged such that the impedance thereof to an alternating current is negligibly small relative to the alternating current impedance of said first and third resistors.

5. The circuit of claim 3 wherein the impedance of said second resistor and said capacitor is arranged such that the impedance thereof to an alternating current is negligibly small relative to the alternating current impedance of said first and third resistors.

6. A single stage amplifier adapted to clip the output signal at predetermined upper and lower levels comprising a transistor having a collector, an emitter and a base, a source of positive potential, a source of negative potential and a source of intermediate potential, said collector being connected to said positive potential, means connected to said emitter, said negative potential and to said intermediate potential for holding said emitter at a potential close to said intermediate potential until the predetermined levels are reached and for reducing the incremental gain of the amplifier after said predetermined levels are reached.

7. The single stage amplifier of claim 6 wherein said means includes a pair of normally conducting, reversely connected diodes in series between said emitter and said point of intermediate potential, one of said diodes ceasing to conduct when said predetermined upper level is reached, the other of said diodes ceasing to conduct when said predetermined lower level is reached.

8. The single stage amplifier of claim 7 wherein said means further includes a first resistor connected between said emitter and said point of negative potential and a second resistor connected between the junction of said series connected diodes and said point of negative potential.

9. A single stage amplifier adapted to clip the upper and lower output signal at a predetermined amplitude without significantly loading the input signal source comprising a NPN transistor having a collector, an emitter and a base, a source having a point of positive potential, a point of negative potential and a point of reference potential, a first resistor connected between said collector and said point of positive potential, a second resistor connected between said emitter and said point of negative potential, a pair of diodes having their cathodes connected together, the anode of one of said diodes being connected to said emitter and the anode of the other said diodes being connected to said point of reference potential, said reference potential having a value intermediate said positive potential and said negative potential, a third resistor connecting the cathodes of said diodes to said point of negative potential, means connected to said base and to said point of reference potential for applying an input signal to said transistor, means connected to said collector and to said point of reference potential for obtaining an output signal from said transistor, said diodes being normally conductive when the output is within the predetermined upper and lower level, said one diode ceasing to conduct when said output reaches said predetermined lower level and said other diode ceasing to conduct when said output reaches said predetermined upper level.

10. The amplifier of claim 9 wherein the impedance of said third resistor is large with respect to the impedance of said second resistor and the impedance of said second resistor is large with respect to the impedance of said first resistor.

References Cited by the Examiner

UNITED STATES PATENTS

| | | | |
|---|---|---|---|
| 2,137,401 | 11/38 | Hobbie | 330—140 X |
| 2,207,905 | 7/40 | Weagant | 330—135 X |
| 2,583,345 | 1/52 | Schade | 330—135 |
| 2,770,684 | 11/56 | Thomas | 328—54 X |
| 2,851,604 | 9/58 | Clapper | 307—88.5 X |
| 2,863,997 | 12/58 | Dome | 330—135 X |
| 2,906,871 | 9/59 | Crawford | 328—171 |
| 2,999,925 | 9/61 | Thomas | 328—54 X |
| 3,041,541 | 6/62 | Gerr | 307—88.5 X |
| 3,094,675 | 6/63 | Ule | 330—140 X |
| 3,124,761 | 3/64 | Fackler et al. | 330—135 X |

JOHN W. HUCKERT, *Primary Examiner.*